United States Patent
Jeong et al.

(10) Patent No.: US 10,138,543 B2
(45) Date of Patent: Nov. 27, 2018

(54) METHOD OF ANALYZING GROWTH OF TWO-DIMENSIONAL MATERIAL

(71) Applicant: Samsung Electronics Co., Ltd., Suwon-si, Gyeonggi-do (KR)

(72) Inventors: Seongjun Jeong, Hwaseong-si (KR); Jaeho Lee, Seoul (KR); Seongjun Park, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/810,948

(22) Filed: Jul. 28, 2015

(65) Prior Publication Data

US 2016/0148369 A1    May 26, 2016

(30) Foreign Application Priority Data

Nov. 25, 2014  (KR) ............... 10-2014-0165501

(51) Int. Cl.

| | |
|---|---|
| C23C 14/34 | (2006.01) |
| C23C 16/455 | (2006.01) |
| C23C 16/56 | (2006.01) |
| C23C 16/04 | (2006.01) |
| C23C 16/26 | (2006.01) |
| C23C 16/40 | (2006.01) |
| C23C 16/52 | (2006.01) |
| G06T 7/00 | (2017.01) |

(52) U.S. Cl.
CPC .............. *C23C 14/34* (2013.01); *C23C 16/04* (2013.01); *C23C 16/26* (2013.01); *C23C 16/405* (2013.01); *C23C 16/45525* (2013.01); *C23C 16/52* (2013.01); *C23C 16/56* (2013.01); *G06T 7/0002* (2013.01); *G06T 2207/10056* (2013.01); *G06T 2207/20056* (2013.01); *G06T 2207/30144* (2013.01); *G06T 2207/30148* (2013.01)

(58) Field of Classification Search
None
See application file for complete search history.

(56) References Cited

U.S. PATENT DOCUMENTS

| | | | | |
|---|---|---|---|---|
| 5,466,934 A | * | 11/1995 | Adams | G01N 23/203 250/307 |
| 5,963,661 A | * | 10/1999 | Kato | G06T 7/0004 348/126 |
| 8,426,120 B2 | | 4/2013 | Huang et al. | |
| 8,610,884 B2 | | 12/2013 | Jung et al. | |

(Continued)

FOREIGN PATENT DOCUMENTS

KR    20100112726 A    10/2010

OTHER PUBLICATIONS

Wang et al. "Atomic layer deposition of metal oxide on pristine and functionalized graphene" JACS Jun. 5, 2008 130, 8152-8153.*

(Continued)

*Primary Examiner* — Mandy C Louie
(74) *Attorney, Agent, or Firm* — Harness, Dickey & Pierce, P.L.C.

(57) ABSTRACT

A method of analyzing growth of a two-dimensional material includes forming a two-dimensional material layer includes defects on a substrate, depositing detection material layers on the defects, and one of (i) capturing an image of the two-dimensional material layer on which the detection material layers are deposited and processing the captured image, or (ii) obtaining map coordinates of the detection material layers and processing the obtained map coordinates.

11 Claims, 7 Drawing Sheets

(56) References Cited

U.S. PATENT DOCUMENTS

| | | | |
|---|---|---|---|
| 2011/0245384 A1* | 10/2011 | Bismarck | B82Y 30/00 524/114 |
| 2012/0141799 A1* | 6/2012 | Kub | B82Y 30/00 428/408 |
| 2013/0071941 A1* | 3/2013 | Miller | G01N 23/223 436/145 |
| 2013/0329039 A1* | 12/2013 | Sakai | G01N 21/9501 348/126 |
| 2013/0344611 A1 | 12/2013 | Lee et al. | |
| 2015/0079683 A1* | 3/2015 | Yager | G01N 21/64 436/5 |
| 2016/0130148 A1* | 5/2016 | Serov | B01J 21/18 502/180 |

OTHER PUBLICATIONS

Fan et al. "Correlation between nanoparticle location and graphene nucleation in chemical vapor deposition of graphene". Jun. 13, 2014. Jounral of materials Chemistry A 2014, 2, 13123.*

Kun Xu, et al. "Theoretical Study of Atomic Layer Deposition Reaction Mechanism and Kinetics for Aluminum Oxide Formation at Graphene Nanoribbon Open Edges", J. Phys. Chem. vol. 114, pp. 10505-10511, (2010).

Dinh Loc Duong, et al. "Probing graphene grain boundaries with optical microscopy", Nature Letter, vol. 490, pp. 235-240, (2012).

Nemes-Incze, Peter, et al. "Revealing the grain structure of graphene grown by chemical vapor deposition." Web. Jul. 13, 2011.

Want, Xinran, et al. "Atomic Layer Deposition of Metal Oxides on Pristine and Functionalized Graphene." Department of Chemistry and Laboratory for Advanced Materials, Jun. 5, 2008.

* cited by examiner

METHOD OF ANALYZING GROWTH OF TWO-DIMENSIONAL MATERIAL

RELATED APPLICATION

This application claims priority under 35 U.S.C. § 119 to Korean Patent Application No. 10-2014-0165501, filed on Nov. 25, 2014, in the Korean Intellectual Property Office, the disclosure of which is incorporated herein in its entirety by reference.

BACKGROUND

1. Field

The present disclosure relates to material growth analysis, and more particularly, to a method of analyzing growth of a two-dimensional material.

2. Description of Related Art

Two-dimensional graphene formed of carbon has high mechanical and electrical characteristics and may be applied various fields. Graphene may be formed by an epitaxial growth method using a silicon carbide substrate or a chemical vapor deposition (CVD) method using catalysis metal.

In order to be applied to various fields, graphene may be manufactured in a large area. In a process of manufacturing graphene in a large area, various defects may be generated. For example, interfaces may be generated among graphene crystals, graphene may be cracked, or parts in which graphene is not formed may be generated. Such defects may deteriorate the performance of graphene.

SUMMARY

Provided is a method of analyzing growth of a two-dimensional material capable of easily observing and analyzing defects generated in a process of growing or composing a two-dimensional material and quantifying the defects.

Additional aspects will be set forth in part in the description which follows and, in part, will be apparent from the description, or may be learned by practice of example embodiments.

According to example embodiments, a method of analyzing growth of a two-dimensional material is provided. The method includes forming a two-dimensional material layer including defects on a substrate, depositing detection material layers on the defects, and one of (i) capturing an image of the two-dimensional material layer on which the detection material layers are deposited and processing the captured image or (ii) obtaining map coordinates of the detection material layers and processing the obtained map coordinates.

In example embodiments, the two-dimensional material may be graphene or a transition metal dichalcogenide (TMD) material.

In example embodiments, the depositing detection material layers may include using a dry deposition method or a wet deposition method.

In example embodiments, the dry deposition method may be one of an atomic layer deposition (ALD) method, a chemical vapor deposition (CVD) method, and a sputtering method.

In example embodiments, the detection material layers may include an inorganic material or an organic material.

In example embodiments, the detection material layers may include one of a metal, a semiconductor, and a dielectric substance.

In example embodiments the dielectric substance may be one of an oxide and a nitride.

In example embodiments, the method may include capturing the image of the two dimensional material layer and processing the captured image. The captured image of the two-dimensional material layer on which the detection material layers are deposited may be one of a transmission electron microscope (TEM) image, a scanning electron microscope (SEM) image, a critical dimension (CD)-SEM image, and an optical microscope (OM) image.

In example embodiments, the method may include the obtaining map coordinates of the detection material layers and the processing the obtained map coordinates. The map coordinates may be a number or a pair of numbers that represent a position of an arbitrary point in the captured image.

In example embodiments, the defects may include at least one of grain boundaries, parts where the two-dimensional material is not formed on the substrate, and multilayer two-dimensional material regions.

In example embodiments, the processing the captured image may include converting the captured image into quantified data.

In example embodiments, the converting the captured image into quantified data may include putting particles on software in the image of the detection material layers and calculating a relative area occupied by the particles by using one of a difference in brightness among the particles, a difference in chroma among the particles, a difference in brightness between the particles and the substrate, and a difference in chroma between the particles and the substrate.

In example embodiments, the converting the captured image into quantified data may include performing a Fourier transform on the captured image to obtain data of a specific bandwidth, and calculating density of the particles put on software in the image of the detection material layers.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
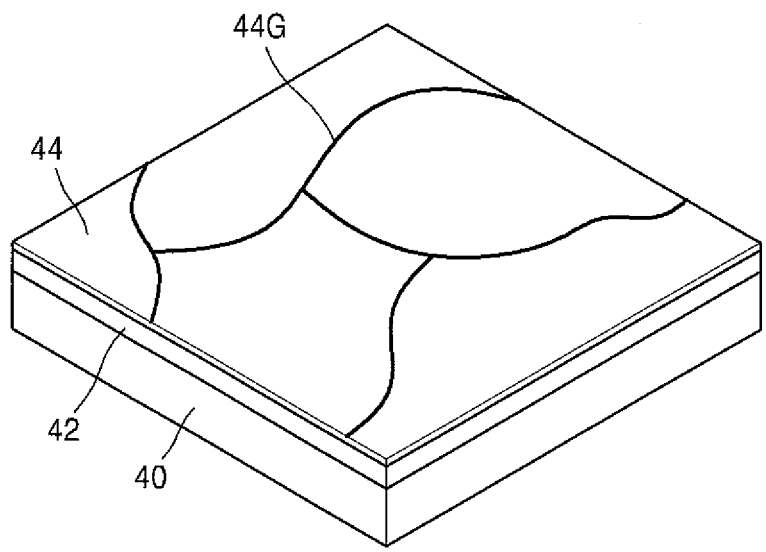
FIGS. 1 and 2 are perspective views illustrating a method of analyzing growth of a two-dimensional material according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a method of analyzing growth of a two-dimensional material according to example embodiments will be described in detail with reference to the accompanying drawings. In the drawings, the thicknesses of layers and regions are exaggerated for clarity.

FIG. 1 is a perspective view illustrating a method of analyzing growth of a two-dimensional material according to example embodiments.

Referring to FIG. 1, a base layer 42 for growing a two-dimensional material is formed on a substrate 40. The base layer 42 may be formed by, for example, a deposition method that is used for depositing metal. The base layer 42 may be, for example, a metal layer. The metal layer may include one of, for example, nickel (Ni), copper (Cu), cobalt (Co), ruthenium (Ru), platinum (Pt), and iridium (Ir). A two-dimensional material layer 44 is formed on the base layer 42. The two-dimensional material layer 44 may be, for example, a graphene layer or a transition metal dichalcogenide (TMD) layer. The two-dimensional material layer 44 may have a large area. The two-dimensional material layer 44 may be formed by a chemical vapor deposition (CVD) method. However, inventive concepts are not limited thereto. In a process of forming the two-dimensional material layer 44, two-dimensional material grain boundaries 44G may be formed. The two-dimensional material grain boundaries 44G may be first defects of the two-dimensional material layer 44. After the two-dimensional material layer 44 is formed, a detection material for detecting the defects of the two-dimensional material layer 44 is deposited on the two-dimensional material layer 44. The detection material may be selectively deposited on (may preferentially react to) the defects included in the two-dimensional material layer 44. Therefore, the detection material is not deposited in parts (parts that do not include the defects) in which the two-dimensional material is normally formed while the detection material is deposited. The detection material may be deposited by using a dry deposition method or a wet deposition method. The dry deposition method may be one of, for example, an atomic layer deposition (ALD) method, a chemical vapor deposition (CVD) method, and a sputtering method. The detection material may be deposited several times for a desired (and/or alternatively predetermined) time. The detection material may be selectively deposited so the detection material is not deposited on a normal two-dimensional material layer among the two-dimensional material grain boundaries 44G. In other words, the detection material may not be formed on the parts of the two-dimensional material layer 44 that do not include the defects. The detection material may be an organic material or an inorganic material. The organic material may be Hydroxy Terminated Polystyrene, Hydroxy Terminated Poly(4-t-butyl styrene), Hydroxy Terminated Poly(methyl methacrylate), Hydroxy terminated Poly(ethyl acrylate), Hydroxy terminated Poly(ethyl methacrylate), Hydroxy terminated Poly(n-butyl acrylate), Hydroxy terminated Poly(n-butylmethacrylate), Hydroxy terminated Poly(benzyl propylacrylate), Hydroxy Terminated Poly(t-butyl methacrylate), Hydroxy Terminated Polyethylene, Hydroxy Terminated Poly(N-isopropyl acrylamide), Hydroxy (carbinol)Terminated Polydimethylsiloxane-Monofunctional, Hydroxy Terminated Poly(2-vinyl pyridine), Hydroxy Terminated Poly(4-vinyl pyridine) and so on. The inorganic material may be metals, semiconductors, or dielectric substances. The metals and the semiconductors may be any metals and semiconductors that are able to react to the defects of the two-dimensional material. For example, the metal may be aluminum (Al), titanium (Ti), ruthenium (Ru), palladium (Pd), or iron (Fe). However, inventive concepts are not limited thereto. The semiconductor may be silicon (Si), germanium (Ge), or GaAs. However, inventive concepts are not limited thereto. The dielectric substance may be an oxide or a nitride. The oxide may be, for example, $Al_2O_3$, $HfO_2$, and $TiO_2$. However, inventive concepts are not limited thereto. The nitride may be, for example, AlN, $Si_3N_4$, or $Hf_3N_4$. However, inventive concepts are not limited thereto.

Figure 2:
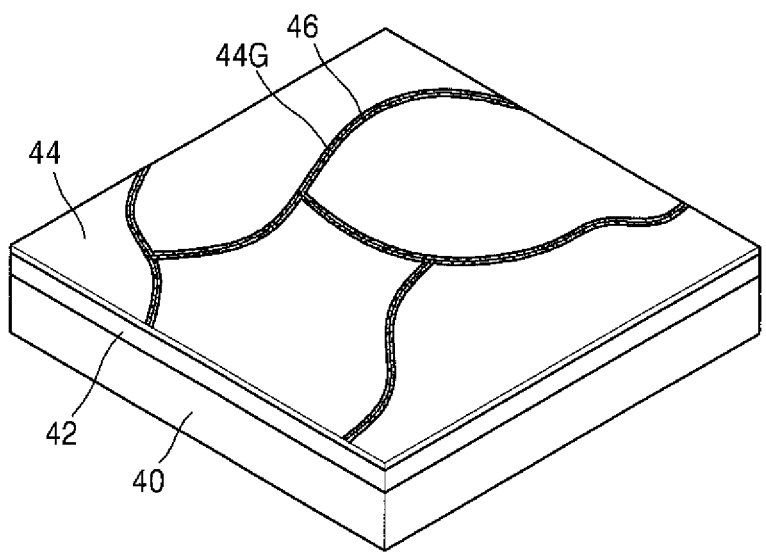

After the detection material is completely deposited, as illustrated in FIG. 2, detection material layers 46 are formed on the grain boundaries 44G of the two-dimensional material layer 44.

Referring to FIG. 2, all the grain boundaries 44G are covered with the detection material layers 46. However, the detection material layers 46 do not exist on the two-dimensional material layer 44 among the grain boundaries 44G.

After the detection material layers 46 are deposited, the two-dimensional material layer 44 and the detection material layers 46 are photographed so that images of the two-dimensional material layer 44 and the detection material layers 46 are captured. The images may be captured by using a transmission electron microscope (TEM), an optical microscope (OM), a scanning electron microscope (SEM), or a critical dimension (CD)-SEM and other photographing devices. The captured images undergo an image processing process. The image processing process includes a process of converting the captured images into quantified data. In the image processing process, when an area of the detection material layers 46 is calculated, particles (dots) are put in image regions corresponding to the detection material layers 46 using a software and the area of the detection material layers 46 may be calculated by using the number of particles. A relative area occupied by the particles may be calculated by using a difference in brightness or chroma among the particles or a difference in brightness or chroma between the particles and a substrate. In addition, the process of converting the captured images into the quantified data may include a process of Fourier transforming the captured images to obtain data of a specific bandwidth and a process of calculating particle density by using the obtained data, that is, a process of calculating a size or area of the detection material.

Through the image processing, the parts on which the detection material layers 46 are deposited (e.g., the grain boundaries 44G that are the defects of the two-dimensional material) may be easily identified and the distribution of the grain boundaries 44G may be grasped. Therefore, it may be quantified in which places and to which degrees the two-dimensional material grain boundaries 44G exist in the two-dimensional material layer 44. The image processing may be performed by using software (e.g., a program) or a combination of software and hardware (e.g., an apparatus implementing an image processing program). One of ordinary skill in art is familiar with image processing software for defect analysis.

On the other hand, map coordinates of the detection material layers 46 are obtained and the obtained map coordinates are processed so that the same result as the image processing may be obtained. The map coordinates may be a number or a pair of numbers that represent a position of an arbitrary point in an image. Here, the position of the arbitrary point may be a position of a specific point in the regions in which the detection material layers 46 are deposited.

Figure 3:
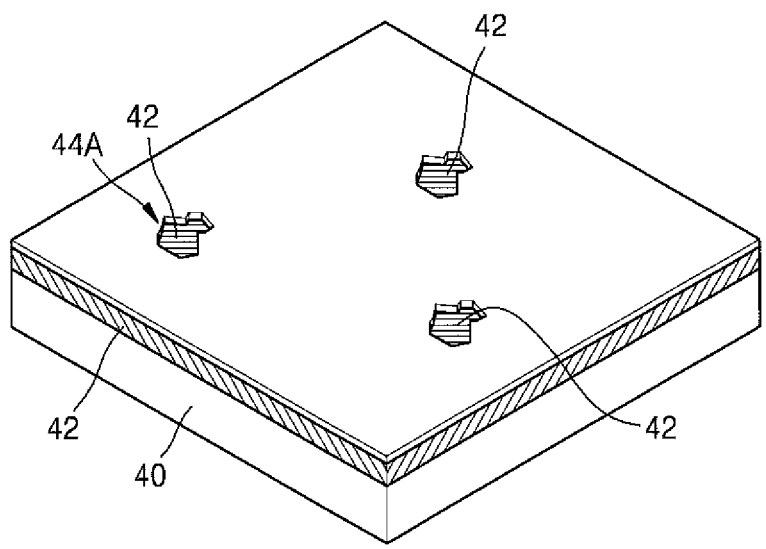
FIGS. 3 and 4 are perspective views illustrating a method of analyzing growth of a two-dimensional material according to example embodiments.
Figure 4:
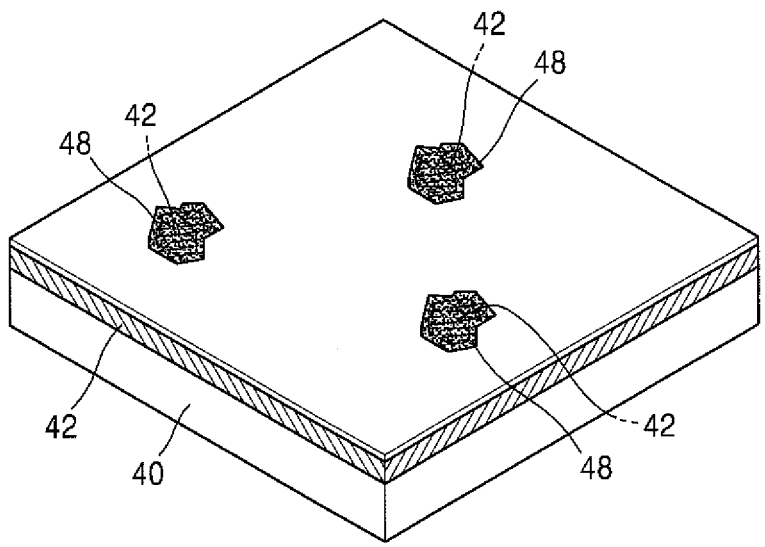

FIGS. 3 and 4 are perspective views illustrating a method of analyzing growth of a two-dimensional material according to example embodiments. Only parts different from the parts described with reference to FIGS. 1 and 2 are described and the same elements are denoted by the same reference numerals.

Referring to FIG. 3, a two-dimensional material layer 44 of a large area is formed on a base layer 42. At this time, the two-dimensional material layer 44 may include second defects 44A. The second defects 44A represent parts in which the two-dimensional material is not formed. Therefore, the base layer 42 under the two-dimensional material layer 44 is exposed through the second defects 44A of the two-dimensional material layer 44. After forming the two-dimensional material layer 44, a detection material depositing process may be performed in the same way as described with reference to FIGS. 1 and 2. As a result of performing the detection material depositing process, as illustrated in FIG. 4, detection material layers 48 are formed on the second defects 44A. The detection material layers 48 cover all the second defects 44A. The detection material layers 48 may be formed of the same detection material used to form the detection material layers 46 described above with reference to FIG. 2.

Then, the image processing process or the map coordinate processing process described with reference to FIGS. 1 and 2 is performed. As a result, since distribution of the second defects 44A in the two-dimensional material layer 44 may be grasped, it may be quantified in which places and to which degrees the second defects 44A exist. In the two-dimensional material layer 44, together with the second defects 44A, the first defects described with reference to FIG. 1 may exist. In this case, the first defects (the grain boundaries) and the second defects 44A may be quantified together in the two-dimensional material layer 44 through the image processing process or the map coordinate processing process.

Figure 5:
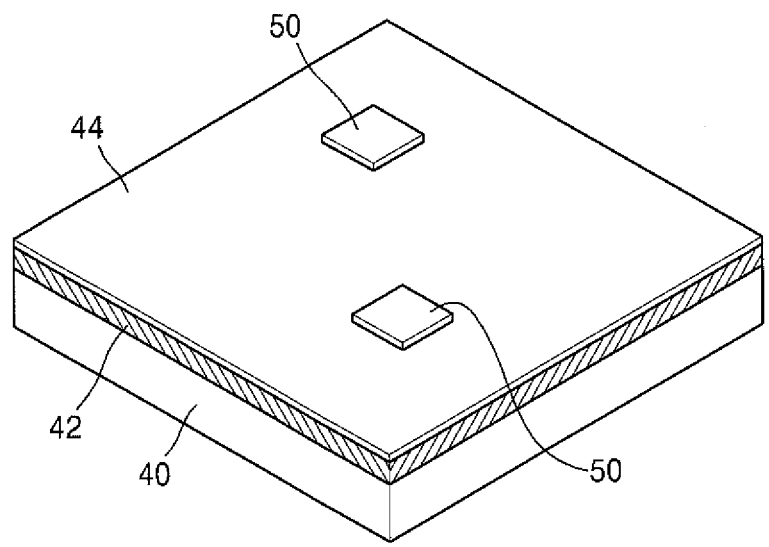
FIGS. 5 and 6 are perspective views illustrating a method of analyzing growth of a two-dimensional material according to example embodiments.
Figure 6:
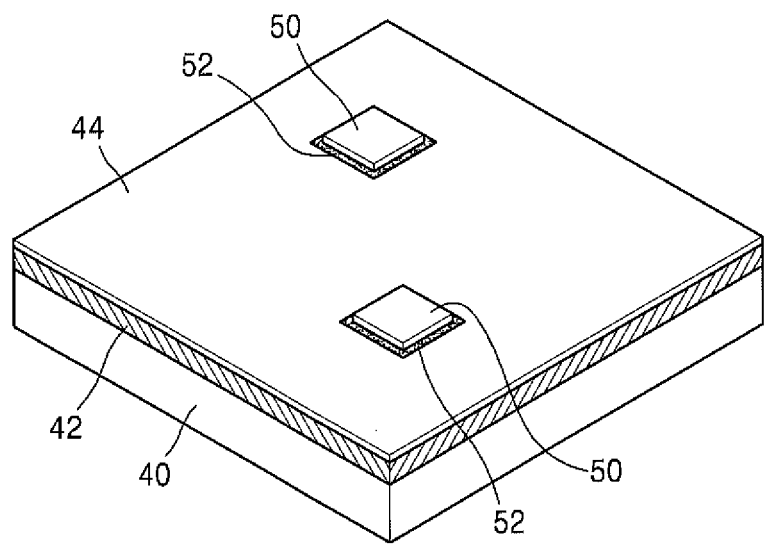

FIGS. 5 and 6 are perspective views illustrating a method of analyzing growth of a two-dimensional material according to example embodiments. Only parts different from the parts described with reference to FIGS. 1 and 2 are described and the same elements are denoted by the same reference numerals.

Referring to FIG. 5, a two-dimensional material layer 44 of a large area is formed on a base layer 42. The two-dimensional material layer 44 may be a single layer. The two-dimensional material layers 44 of FIGS. 1 and 3 may be single layers. The two-dimensional material layer 44 may include multilayer two-dimensional material regions 50. The multilayer two-dimensional material regions 50 include a plurality of two-dimensional material layers including the two-dimensional material layer 44. Boundaries between edges of the multilayer two-dimensional material regions 50 and the two-dimensional material layer 44 may operate as defects such as the grain boundaries. Therefore, after the detection material depositing process is performed by the same method as described with reference to FIGS. 1 and 2, as illustrated in FIG. 6, detection material layers 52 are deposited only on the boundaries between the edges of the multilayer two-dimensional material regions 50 and the two-dimensional material layer 44. The detection material layers 52 may be formed of the same detection material used to form the detection material layers 46 described above with reference to FIG. 2.

Then, the image processing process or the map coordinate processing process described with reference to FIGS. 1 and 2 may be performed. At this time, images may be captured by using the TEM, the SEM, or the CD-SEM. Since distribution of the defects displayed by the detection material layers 52 in the two-dimensional material layer 44 may be grasped through the image processing process, it may be quantified in which places and to which degrees the defects, that is, the multilayer two-dimensional material regions 50 exist. In the two-dimensional material layer 44, the first defects (the grain boundaries) described with reference to FIG. 1, the second defects 44A described with reference to FIG. 3, and the defects (the multilayer two-dimensional material regions 50) described with reference to FIG. 5 may exist together. In this case, the above-described defects in the two-dimensional material layer 44 may be quantified through the image processing process or the map coordinate processing process.

Figure 7:
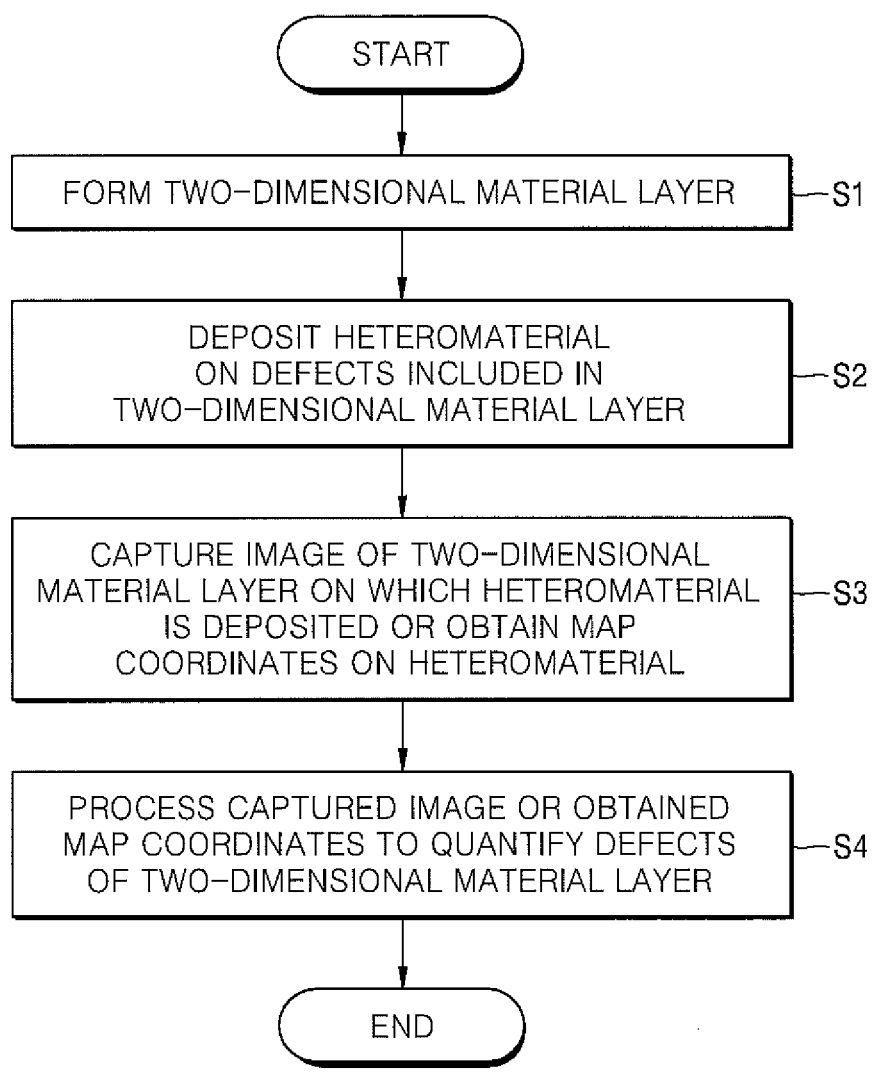
FIG. 7 is a flowchart illustrating methods of analyzing growth of a two-dimensional material according to example embodiments.

FIG. 7 is a flowchart illustrating methods of analyzing growth of a two-dimensional material according to example embodiments.

Referring to FIG. 7, first, a two-dimensional material layer is grown (formed) in operation S1. Then, a heteromaterial is deposited on defects included in the grown two-dimensional material layer in operation S2. Here, the heteromaterial may be one of the detection material layers 46, 48, and 52.

Then, an image of the two-dimensional material layer on which the heteromaterial is deposited is captured or map coordinates on the heteromaterial are obtained in operation S3. The image may be captured by performing photographing. Then, the captured image or the obtained map coordinates are image processed so that the defects included in the two-dimensional material layer are quantified in operation S4.

Figure 8:
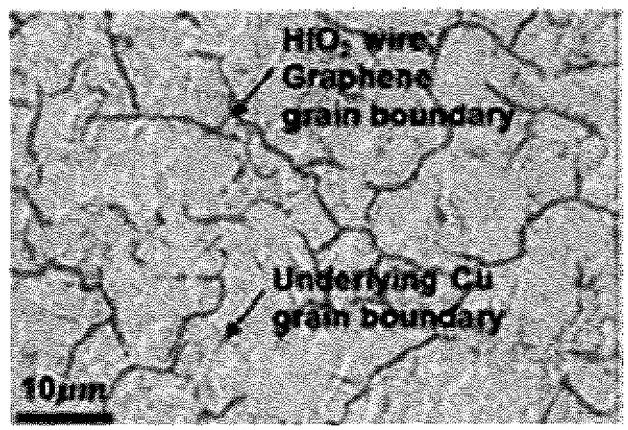
FIGS. 8 to 10 illustrate an OM image and scanning electron microscope (SEM) images that are captured in a first experimental example performed by a method of analyzing growth of a two-dimensional material according to example embodiments.
Figure 9:
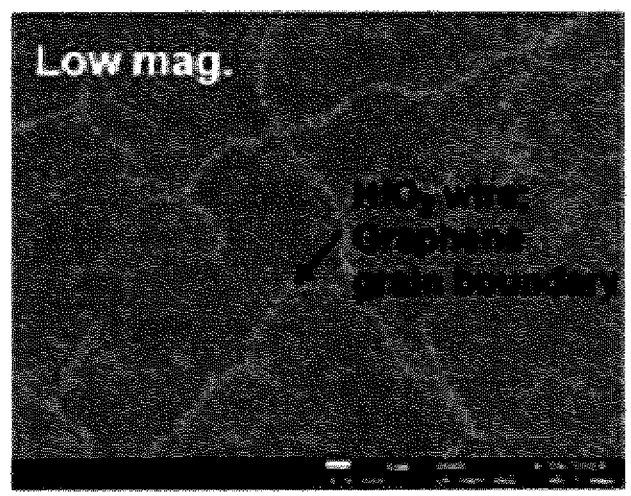
Figure 10:
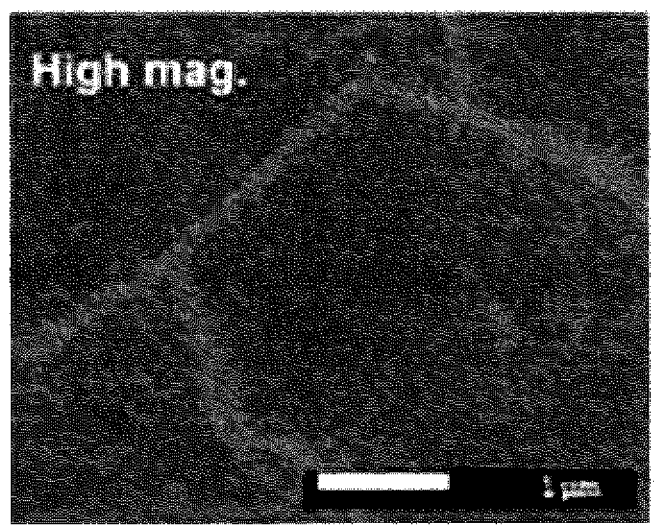

FIGS. 8 to 10 illustrate an OM image and scanning electron microscope (SEM) images that are captured in a first experimental example performed by a method of analyzing growth of a two-dimensional material according to example embodiments. In the first experimental example, graphene is used as the two-dimensional material. In the first experimental example, the ALD method is used for depositing a detection material on defects of the two-dimensional material and HfO2 is used as the detection material.

FIG. 8 illustrates the OM image captured after the two-dimensional material is formed and the detection material depositing process is completed. In FIG. 8, thick lines represent the detection material HfO2 deposited on the defects (grain boundaries) of the two-dimensional material. FIGS. 9 and 10 illustrate the SEM images captured after the two-dimensional material is formed and the detection material depositing process is completed. The image of FIG. 10 has a higher magnification than that of FIG. 9.

Figure 11:
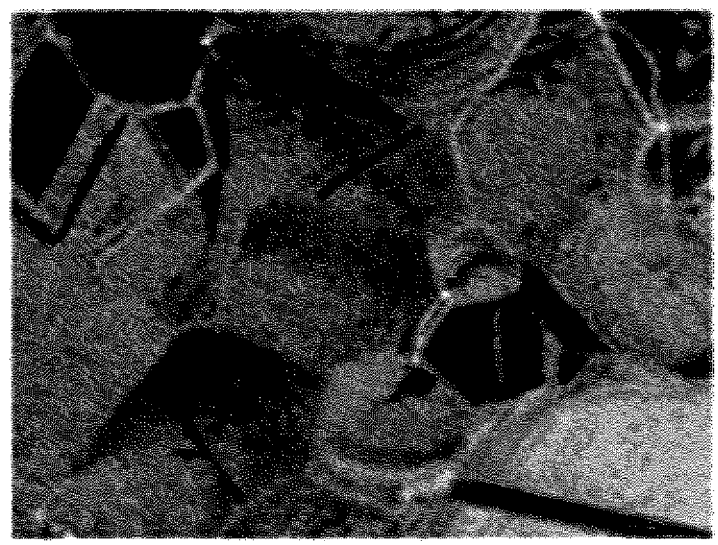
FIGS. 11 to 13 illustrate SEM images captured in a second experimental example performed by a method of analyzing growth of a two-dimensional material according to example embodiments and an image processing result.
Figure 12:
Figure 13:
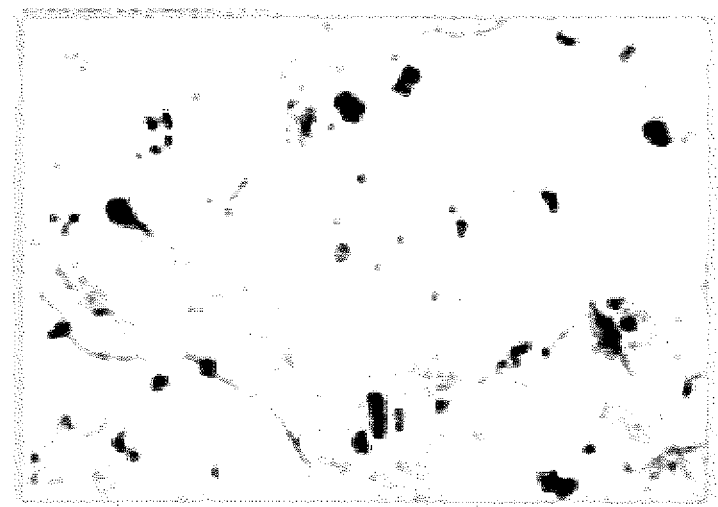

FIGS. 11 to 13 illustrate SEM images captured in a second experimental example performed by a method of analyzing growth of a two-dimensional material according to example embodiments and an image processing result.

In the second experimental example, graphene is used as the two-dimensional material. In the second experimental example, the ALD method is used for depositing a detection material and the ALD is performed 10 cycles. $Al_2O_3$ is used as the detection material.

FIG. 11 illustrates a CD-SEM image in a state in which the two-dimensional material layer is formed and the detection material is not deposited.

FIG. 12 illustrates a CD-SEM image after an ALD process for depositing the detection material on the two-dimensional material layer is completed. In FIG. 12, brighter parts, that is, regions one of which is marked with "non-covered regime" (an arrow) represent detection material layers deposited on parts (defects of the two-dimensional material) in which the two-dimensional material is not formed. Therefore, in FIG. 12, the brighter parts represent the defects of the two-dimensional material. FIG. 13 illustrates the result of performing image processing (for example, image converting) on the result of FIG. 12. The image processing may be performed by using software (e.g., a program) or a combination of software and hardware (e.g., an apparatus implementing an image processing program). One of ordinary skill in art is familiar with image processing software for defect analysis. As the result of performing the image processing, as illustrated in FIG. 13, the defects of the two-dimensional material are marked with black. Referring to FIG. 13, distribution of the defects of the two-dimensional material may be grasped and sizes and shapes of the defects of the two-dimensional material may be grasped. Based on the above, the defects of the two-dimensional material may be quantified and quality of the formed two-dimensional material may be grasped.

In the disclosed two-dimensional material growth analyzing method, since the entire two-dimensional material layer including the defects may be scanned, the defects may be easily found from the large area two-dimensional material layer. In addition, since the heteromaterial (detection material) is deposited only on the various defects of the two-dimensional material, the various defects including the defects of the multilayer two-dimensional material may be easily identified. The image of the two-dimensional material layer on which the heteromaterial is deposited is captured and the captured image is processes so that it may be quantified in which places and to which degrees the defects are distributed in the two-dimensional material layer.

It should be understood that the example embodiments described therein should be considered in a descriptive sense only and not for purposes of limitation. Descriptions of features or aspects within each method according to example embodiments should typically be considered as available for other similar features or aspects in other methods according to example embodiments.

While one or more example embodiments have been described with reference to the figures, it will be understood by those of ordinary skill in the art that various changes in form and details may be made therein without departing from the spirit and scope of the following claims.

What is claimed is:

1. A method of analyzing growth of a two-dimensional material, the method comprising:
   forming a two-dimensional material layer on a substrate, the two-dimensional material layer including defects;
   depositing detection material layers on the defects, the detection material layers including a dielectric substance, the dielectric substance being an inorganic material that is a nitride,
      wherein the nitride is one of AlN, $Si_3N_4$, and $HfN_4$; and
      one of
         capturing an image of the two-dimensional material layer on which the detection material layers are deposited and processing the captured image, or
         obtaining map coordinates of the detection material layers and processing the obtained map coordinates.

2. The method of claim 1, wherein the two-dimensional material is graphene or a transition metal dichalcogenide (TMD) material.

3. The method of claim 1, wherein the depositing detection material layers includes using a dry deposition method or a wet deposition method.

4. The method of claim 3, wherein the dry deposition method is one of an atomic layer deposition (ALD) method, a chemical vapor deposition (CVD) method, and a sputtering method.

5. A method of analyzing growth of a two-dimensional material, the method comprising:
   forming a two-dimensional material layer on a substrate, the two-dimensional material layer including defects;
   depositing detection material layers on the defects, wherein the detection material layers include an organic material, wherein the organic material is one of Hydroxy Terminated Polystyrene, Hydroxy Terminated Poly(4-t-butyl styrene), Hydroxy terminated Poly(ethyl acrylate), Hydroxy terminated Poly(n-butyl acrylate), Hydroxy terminated Poly(n-butylmethacrylate), Hydroxy terminated Poly(benzyl propylacrylate), Hydroxy Terminated Poly(t-butyl methacrylate), Hydroxy Terminated Polyethylene, Hydroxy Terminated Poly(N-isopropyl acrylamide), Hydroxy (carbinol)Terminated Polydimethylsiloxane-Monofunctional, Hydroxy Terminated Poly(2-vinyl pyridine), and Hydroxy Terminated Poly(4-vinyl pyridine); and
   one of
      capturing an image of the two-dimensional material layer on which the detection material layers are deposited and processing the captured image, or
      obtaining map coordinates of the detection material layers and processing the obtained map coordinates.

6. The method of claim 1, wherein the method includes the capturing the image of the two dimensional material layer and processing the captured image, and
   the captured image of the two-dimensional material layer on which the detection material layers are deposited is one of a transmission electron microscope (TEM) image, a scanning electron microscope (SEM) image, a critical dimension (CD)-SEM image, and an optical microscope (OM) image.

7. The method of claim 1, further comprising:
   obtaining a captured image of the two-dimensional material layer, wherein
   the method includes the obtaining map coordinates of the detection material layers and the processing the obtained map coordinates, and
   the map coordinates are a number or a pair of numbers that represent a position of an arbitrary point in the captured image.

8. The method of claim 1, wherein the defects include at least one of grain boundaries, parts in where the two-dimensional material is not formed on the substrate, and multilayer two-dimensional material regions.

9. The method of claim 1, wherein the processing the captured image includes converting the captured image into quantified data.

10. The method of claim 9, wherein the converting the captured image into quantified data includes:
   putting particles on software in the image of the detection material layers, and
   calculating a relative area occupied by the particles by using one of,
      a difference in brightness among the particles,
      a difference in chroma among the particles,
      a difference in brightness between the particles and the substrate, and
      a difference in chroma between the particles and the substrate.

11. The method of claim 10, wherein converting the captured image into quantified data includes:
   performing a Fourier transform on the captured image to obtain data of a specific bandwidth, and
   calculating density of the particles put on software in the image of the detection material layers.

* * * * *